United States Patent [19]

Critchlow et al.

[11] 3,798,512

[45] Mar. 19, 1974

[54] FET DEVICE WITH GUARD RING AND FABRICATION METHOD THEREFOR

[75] Inventors: Dale L. Critchlow, Lincolndale; Stanley E. Schuster, Granite Springs, both of N.Y.

[73] Assignee: International Business Machines Corporation, Armonk, N.Y.

[22] Filed: Sept. 28, 1970

[21] Appl. No.: 76,286

Related U.S. Application Data

[63] Continuation of Ser. No. 766,894, Oct. 11, 1968, abandoned.

[52] U.S. Cl. .......... 317/235 R, 317/235 B

[51] Int. Cl. .......... H01l 11/14

[58] Field of Search .......... 317/235, 21.1, 22.2, 46; 307/304

[56] References Cited

UNITED STATES PATENTS

| | | | |
|---|---|---|---|
| 3,335,296 | 8/1967 | Smart | 317/235 |
| 3,400,383 | 9/1968 | Meadows et al. | 317/235 |
| 3,445,924 | 5/1969 | Cheroff et al. | 317/235 |
| 3,502,950 | 4/1970 | Nigh et al. | 317/235 |
| 3,573,509 | 4/1971 | Crawford | 317/235 |
| 3,076,104 | 1/1963 | Miller | 317/235 |
| 3,400,383 | 9/1968 | Meadows et al. | 317/235 |
| 3,427,445 | 2/1969 | Dailey | 317/235 |
| 3,447,046 | 5/1969 | Cricchi et al. | 317/235 |

OTHER PUBLICATIONS

IBM Tech. Discl. Bull. "Use of the MOS Substrate as a Control Element" by McDowell Vol. 10, No. 7, 12/67 page 1,032

*Primary Examiner*—Jerry D. Craig
*Attorney, Agent, or Firm*—Hanifin & Jancin

[57] ABSTRACT

An N-channel FET device is provided with an N type guard ring to prevent surface leakage by an inversion layer formed at the surface of the FET device that is covered with an insulating layer. The guard ring is preferably an N+ diffused layer or region that surrounds the FET device. For integrated circuit applications where a plurality of FET devices are used, N+ guard rings either surround each device or a group of devices. The guard ring is electrically connnected to ground and the P type substrate is reverse biased thereby preventing surface leakage.

7 Claims, 4 Drawing Figures

INVENTORS
DALE L. CRITCHLOW
STANLEY E. SCHUSTER

BY Harry M Weiss
ATTORNEY

FET DEVICE WITH GUARD RING AND FABRICATION METHOD THEREFOR

This application is a continuation of application Ser. No. 766,894 filed Oct. 11, 1968 and now abandoned.

BACKGROUND OF THE DISCLOSURE

This invention relates to an improved semiconductor device and fabrication method therefor, and, more particularly, to an N-channel FET device having an N+ guard ring and fabrication method therefor.

DESCRIPTION OF THE PRIOR ART

In the past, it was recognized that a semiconductor surface inverted to either a P type or N type conductivity due to the effect of a charge in the insulator located on the inverted semiconductor surface. For example, a layer of silicon dioxide on a silicon semiconductor substrate generally causes the substrate surface to become inverted to N type conductivity if the substrate was a P type body. Similarly, an aluminum oxide layer located on a silicon substrate causes the substrate surface to invert to a P type conductivity if the substrate body was of N type conductivity.

Various means and techniques were devised to overcome this inversion effect on the surfaces of semiconductor substrates. One technique was to diffuse into the surface an annular region of the opposite type conductivity than the inverted surface layer thereby preventing the inverted layer from extending across the surface of the semiconductor device which would create shorting and leakage problems.

Another technique was to place metal layers over selected portions of the insulating layer located on the substrate surface and by appropriate biasing affect the inversion at the insulator-semiconductor surface located beneath the biased metal layer.

In making normally ON N-channel FET devices having source and drain regions of N type conductivity, the surface inversion problem, for silicon, became extremely critical since the surface leakage along the inversion layer at the semiconductor-insulator interface was very serious. The use of additional metalized regions on the insulator surface to control the inversion problem created unnecessary wiring problems as well as capacitance effects that were undesirable. Similarly, the use of an additional diffusion operation of the opposite conductivity type than the conductivity of the inversion layer to prevent the inversion layer from extending across the surface of the device was also undesirable since it meant that an extra diffusion step has to be carried out of the opposite conductivity type. This became very important when designing and fabricating FET devices since the simplicity of the FET design which is to use only a single diffusion operation of one conductivity type would be lost if more than one diffusion operation had to be performed of different conductivity types.

Accordingly, it is an object of this invention to provide an improved semiconductor device.

It is a further object of this invention to provide an improved FET device.

It is a still further object of this invention to provide a method for making a semiconductor device which overcomes surface leakage problems due to inversion layers.

It is another object of this invention to provide an improved N-channel FET device.

It is still another object of this invention to provide an improved N-channel silicon FET device and fabrication method therefor.

In accordance with one embodiment of this invention, an N-channel FET semiconductor device is provided with N type source and drain regions. The semiconductor substrate is of P type conductivity and a guard ring of the same conductivity type as the source and drain diffusions is provided for the purpose of preventing inversion across the entire surface of the semiconductor substrate that is in contact with an insulating layer located thereon. Preferably, the guard ring is formed in the same diffusion operation that makes the source and drain regions of the device. Contacts are provided to the source and drain regions as well as to the substrate and the guard ring. Means are provided to apply a reverse bias to the substrate. In turning the FET device on, the guard ring and the source region of the FET device are preferably at ground potential. Preferably the guard ring is at a potential higher than the substrate potential and can be even higher than the drain potential. The gate electrode as well as the electrode connected to the drain region are normally at a positive potential. The device operates in an enhancement mode.

In accordance with another embodiment of this invention, a method is provided for fabricating the N-channel FET device of this invention. This method includes the step of simultaneously forming the source, drain and guard ring of the FET device in one diffusion operation.

The foregoing and other objects, features and advantages of the invention will be appreciated from the following more particular description of the preferred embodiments of the invention, as illustrated in the accompanying drawings.

DESCRIPTION OF THE PREFERRED EMBODIMENTS

Figure 1:
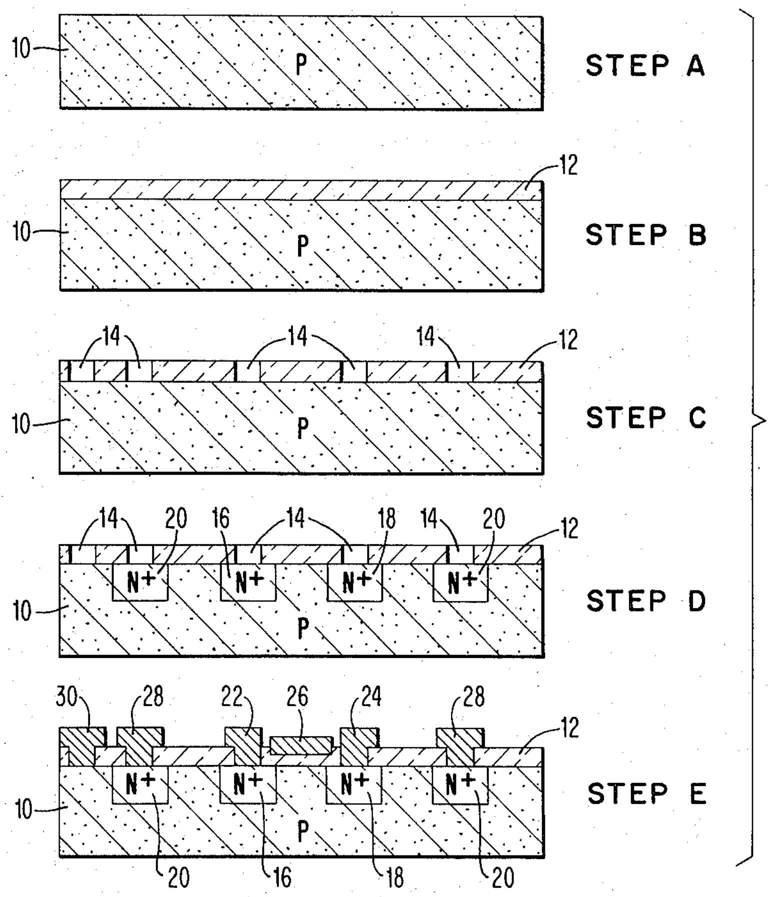
FIG. 1 is a flow diagram in cross-section, illustrating the steps in fabricating an N-channel FET device in accordance with this invention.

Referring to FIG. 1, step A depicts in cross-section, a semiconductor substrate 10 of P type conductivity. The substrate 10 is preferably of silicon and has a resistivity of about 2 ohms-centimeter. This substrate can be formed, for example, by the usual monocrystalline growth of a rod of semiconductor material from a melt doped with a P type impurity such as boron. Subsequently, by conventional semiconductor rod cutting techniques, semiconductor wafer size slices are cut from the bar. The substrate 10 shown in step A is preferably an 8 mil thick section of a wafer that has been formed in the manner outlined above and then subjected to the standard polishing operations.

In step B, an insulating or silicon dioxide layer 12 is formed on the surface of the substrate 10 by either deposition or thermal growth techniques. The thickness of the insulating layer 12 is about 5,000 A. The insulating layer serves two functions one of which is to provide a diffusion mask and the other of which is to serve as an insulating layer between metal lands or conductors extending over the surface of the insulating layer into contact with the semiconductor regions of the substrate 10 that are exposed by openings in the insulating layer.

In step C, conventional photolithographic masking and etching techniques form openings 14 in the insulating layer 12. While the insulating layer has been described to be preferably silicon dioxide, it should be evident to those skilled in the art that insulating material such as silicon nitride, alumina, etc., can be used in lieu of silicon dioxide. Depending upon the particular insulating material used or selected for insulating layer 12, various etchants, well known in the art, can be used to form the openings 14.

In step D, a diffusion operation is carried out to form N+ type diffused regions 16 and 18 which serve as source and drain regions, respectively. The N+ diffusion operation also forms an annular or surrounding guard ring region 20 that is located about the source and drain diffused regions 16 and 18. The diffusion operation uses an N type dopant such as arsenic or phosphorus and the $C_0$ of the N+ type diffused regions is preferably $10^{19}$ or $10^{20}$ impurities per cubic centimeter. The depth of the diffused region is preferably in the range of 2 to 4 microns and the channel or distance between the source of drain regions is preferably between about 3 to 50 microns wide.

In step E, metal ohmic contacts 22 and 24 are provided to the source 16 and drain 18 regions, respectively, by a metallization operation preferably using the same openings that were initially formed in the insulating layer 12. It should be evident to those skilled in the art that photolithographic masking and etching techniques are used, if desired, to reform the openings 14 prior to the metallization step in the event that during an oxidation drive in diffusion operation an oxide layer is formed that covers the semiconductive surface thereby preventing the opening from penetrating to the semiconductor surface. Prior to the metallization or metal deposition step for forming the contacts on the regions of the semiconductor device that are exposed by the openings in the insulation layer, an etching operation is performed using photolithographic masking and etching techniques to reduce the insulating or oxide layer thickness over the channel region located between the source 16 and drain 18 regions. After this etching operation, a gate electrode 26 is formed during the metallization or metal deposition process or operation. Simultaneous with the formation of the contacts 22 and 24, and gate electrode 26, an annular contact 28 is provided to the guard ring region 20. Similarly, an ohmic contact 30 is provided to the P type substrate 10 during the metal deposition process. The metal used to make ohmic contact to the various semiconductor regions is preferably aluminum, however, other suitable metals can be used which provide ohmic contacts trthe various semiconductor regions. As an example, platinum can be used as the ohmic contact material since it forms a platinum silicide alloy contact or electrode. Step E completes the process for the formationof the FET structure of thi invention.

Figure 2:
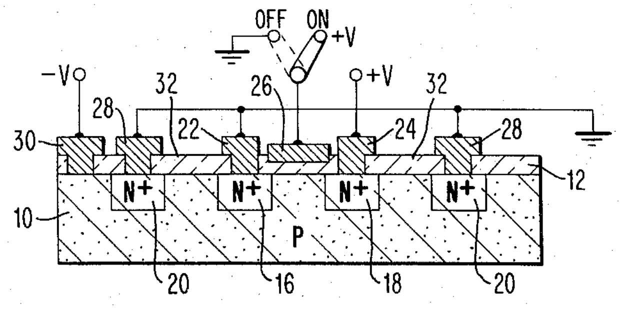
FIG. 2 is a cross-sectional view of the completed device of FIG. 1 showing the different potentials applied to the different regions of the device to place the device in an ON condition while preventing surface leakage.

Referring to FIG. 2, similar reference numerals used in FIG. 1 are repeated in FIG. 2. In FIG. 2, a +V voltage source or means is provided to bias the gate electrode 26 with a positive potential to form the N type channel between source and drain regions 16 and 18, respectively, thereby turning on the FET device. This shown in FIG. 2 with a switch arrangement in the on position which is connected to the +V potential source. The off position is shown in dotted form where the switch can be moved to be connected to ground or a negative potential source. The source and guard ring regions 16 and 20, respectively, are electrically connected to ground while the drain region 18 is connected to a positive potential source +V. The substrate 10 which is of P type conductivity is connected to a negative potential source −V by means of contact 30.

In this arrangement, the FET device can be turned on by selecting the on position for the gate electrode 26 which creates a channel between the source and drain regions 16 and 18, respectively. By providing the guard ring region 20 at either a ground or positive potential and by reverse biasing th P type substrate 10 it was discovered that the semiconductor area between the guard ring region 20 and the diffused source 16 or drain 18 regions became depleted of charge carriers thereby preventing current leakage or shorting. As a result, the FET action or effect created by charged insulation layer portion 32 on the semiconductor surface extending between the source 16 and drain 18 regions and the guard ring region 20 is significantly reduced thereby preventing current conduction between these regions.

Figure 3:
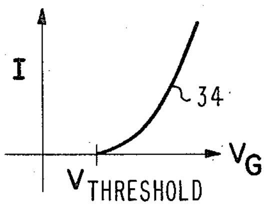
FIG. 3 is a graph showing the I-V curve generated when a gate potential above a threshold value is applied to the FET device resulting in the increased conduction between the source and drain regions.

Referring to FIG. 3, curve 34 illustrates the I-V curve that is generated by applying a potential on the gate of an FET type device or structure that is above the threshold voltage necessary to turn on the device. As shown in this figure, the current across the device increases from a zero value to an increasing positive value as the potential on the gate electrode increases above the particular threshold value needed to turn on the device. Similarly, the charged insulating layer portion 32 acts much in the same manner as a gate electrode and serves to permit current to conduct along the surface of the device between the diffused regions 16, 18 and guard ring 20 when the potential of the charged insulating layer portion 32 exceeded the threshold value needed for current conduction between the diffused regions.

Figure 4:
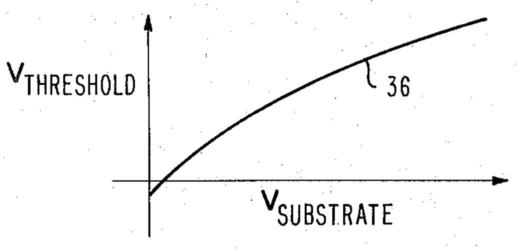
FIG. 4 is a graph showing the increase in the V threshold potential of the FET device of FIG. 2 required to have conduction across the surface of the device to the guard ring due to the presence of a properly biased guard ring when a potential is applied to the substrate.

Referring to FIG. 4, curve 36 illustrates how the threshold voltage of the charged insulation layer portion 32 needed to create conduction between source 16 and drain 18 regions and the guard ring region 20 is increased due to the presence of the suitably biased guard ring 20 and the reverse biased substrate 10. Hence, by this biasing arrangement and the use of the guard ring 20, the threshold voltage needed by the charged insulation portion layer 32 to create this unwanted surface leakage current became larger than could be achieved by the natural stored charge in the insulating layer portion 32. As a result, no leakage current problem exists by means of this arrangement.

Various arrangements or embodiments can be made within the spirit and scope of this invention. For example, epitaxial regions can be used in lieu of diffused regions. The epitaxial regions for the source, drain and guard ring areas would be formed after suitable etching of the substrate.

In addition, the conductivity type of the various semiconductor regions of the FET device including the substrate can be reversed to the opposite conductivity type, if desired, and by changing the biasing to accommodate the changes in conductivity, the principle of this invention which is to avoid surface leakage problems, can also be used to overcome surface leakage currents when an insulation layer such as alumina is used which stores negative charges thereby creating the opposite type inversion than the silicon dioxide layer.

While the invention has been particularly shown and described with reference to preferred embodiments thereof, it will be understood by those skilled in the art that the foregoing and other changes in form and details may be made therein without departing from the spirit and scope of the invention.

We claim:

1. A semiconductor device having reduced surface leakage current, comprising:

A semiconductor substrate of one conductivity type having portions of one surface coated with an insulating material which produce an inversion surface layer on said one surface which is of opposite conductivity type to the conductivity type of said substrate, a source region and a drain region of opposite conductivity type than said substrate, said source and drain regions being located in said one surface of said substrate, a gate electrode located over the region between said source and drain regions, potentials applied to said gate electrode affecting the conductivity of the region between said source and drain region, a guard means which is reverse-biased with respect to said substrate and is located around said source and drain regions and separate from said source for preventing surface current leakage from said source and drain regions, said guard means being located in said one surface and having the same conductivity type as said source and drain regions, bias means for applying potentials to said substrate and to said source and drain regions and to said guard means, said source and drain regions and said guard means being biased to prevent surface current leakage from said source and drain regions, said guard means being reverse biased with respect to said substrate.

2. The device of claim 1, wherein said source and drain regions are of N-type conductivity and said substrate is of P-type conductivity.

3. The device of claim 1, where said source and drain regions are of P-type conductivity and said substrate is of N-type conductivity.

4. The device of claim 1, wherein said source and drain regions are reverse biased with respect to said substrate.

5. The semiconductor device of claim 1, where said substrate is silicon and said insulating material is a compound of silicon.

6. The semiconductor device of claim 1, where said insulating material comprises alumina.

7. The device of claim 1, where said source and drain regions, and said guard means are diffused regions located in said one surface of said substrate.

* * * * *